United States Patent [19]

Burgoon

[11] 4,378,532
[45] Mar. 29, 1983

[54] OSCILLATOR MODE SUPPRESSION APPARATUS HAVING BANDPASS EFFECT

[75] Inventor: John R. Burgoon, Campbell, Calif.

[73] Assignee: Hewlett Packard Company, Palo Alto, Calif.

[21] Appl. No.: 296,746

[22] Filed: Aug. 27, 1981

Related U.S. Application Data

[63] Continuation of Ser. No. 26,276, Apr. 2, 1979.

[51] Int. Cl.³ .............................................. H01P 1/18
[52] U.S. Cl. ................................. 331/158; 331/116 R
[58] Field of Search ............... 331/117 R, 116 R, 158, 331/159, 160, 164

[56] References Cited

U.S. PATENT DOCUMENTS 2,608,648 8/1952 Magnuski ............................ 331/164
3,560,879 2/1971 Fuchs .................................. 331/158

Primary Examiner—David K. Moore
Attorney, Agent, or Firm—Jon R. Stark; Allston L. Jones

[57] ABSTRACT

An apparatus utilizing the basic oscillation characteristics of the Colpitts or Pierce and Hartley oscillator configurations. In this embodiment the basic shunt reactive shunt arms are replaced with a selected pair of tank circuits or one of the shunt arms with a series-parallel tank circuit.

These tank circuits are tuned such that the sign of their effective reactances are the same between the range of resonant frequencies of the individual tank circuits or of the series and parallel resonant frequencies of the series-parallel tank. When this occurs and their sign differs from the sign of the effective reactance of the series reactive element, there is a 180° signal phase shift in the feedback loop, and therefore oscillation.

14 Claims, 15 Drawing Figures

OSCILLATOR MODE SUPPRESSION APPARATUS HAVING BANDPASS EFFECT

This is a continuation of application Ser. No. 026,276, filed Apr. 2, 1979.

BACKGROUND AND SUMMARY OF THE INVENTION

This invention is concerned generally with oscillators, and more particularly with resonator oscillators that generate a signal within a selected band of frequencies having no unwanted or spurious outputs above or below the selected band frequencies.

A typical resonator oscillator will oscillate not only at the frequency for which it was designed, but also at certain harmonics and sub-harmonics of that frequency, plus other spurious frequencies. To separate the desired frequency from the others, various mode suppression techniques have been employed in the past. These techniques include: resonant traps to suppress each unwanted frequency; low pass traps for frequencies below the desired frequency; and post oscillator filters.

Each of these approaches is a limited, incomplete, solution to the problem. The resonant trap approach requires that each of the unwanted frequency modes be identified and a separate filter be included in the circuit to suppress each of those modes. This results in the addition of a large number of additional parts which quickly increases the resistive loss in the circuit.

The low pass trap approach, while requiring fewer additional parts than the resonant trap approach, only removes the undesired modes below the desired mode. There is no suppression of the higher frequency modes. A Pierce oscillator of the type described on page 70 and shown in FIGS. 7-2 on page 59 of *Crystal Oscillator Design And Temperature Compensation* by Marvin E. Frerking, copyright 1978 is illustrative of this type of mode suppression.

Post oscillator filters, while often providing a satisfactory solution to the problem, probably more times than not do not present a satisfactory solution. The downfall of this solution comes when the desired frequency mode is weak and is dominated by one or more stronger, unwanted modes. Murphy's law tells us that it is more likely that the mode we are interested in will be the weak mode.

To overcome the shortcomings of each of the above-mentioned techniques, the circuit of the oscillator feedback path should be such that the phase of the feedback signal is 180° only for a narrow band of frequencies which includes the desired frequency. Through the use of such an approach, any number of unwanted oscillation modes both above and below the desired oscillation frequency could be suppressed successfully. The instant invention presents such an approach.

In accordance with the preferred embodiment, the present invention includes an inverting amplifier and a feedback path between the input and output terminals of the amplifier. This feedback path includes a series reactive element in the form of a crystal resonator and a pair of shunt reactive elements one end of each being connected to the two ends of the crystal resonator and the second ends of the shunt elements connected together to form a common line.

There are two basic embodiments of the present invention. They are a two-arm bandpass mode suppression configuration and a one-arm bandpass mode suppression configuration. In the two-arm configuration one of the shunt reactive elements includes a parallel resonant tank and the second of the shunt reactive elements includes a series resonant tank. Each of these tanks have a resonant frequency at which the sign of the reactance of the tank switches from positive to negative. By the proper choice of the values of the capacitors and inductors in each of these tanks these two resonant frequencies can be made to define a band of frequencies substantially between which the feedback path provides a phase shift of 180°.

In the one-arm bandpass mode suppression configuration one of the shunt elements includes a non-resonant reactive circuit, while the other shunt element includes a resonant tank with both a series and a parallel resonant path. In this configuration the series resonant frequency and the parallel resonant frequency of that shunt element define the band of frequency between which oscillation is possible.

Each of these configurations lend themselves equally to both the Colpitts or Pierce and the Hartley oscillator configurations. In each of these basic oscillator configurations, a feedback path phase shift of 180° is only possible when the sign of the series reactance element is different from the sign of both of the shunt reactance elements. To achieve this within the desired band of frequencies, the sign of the effective reactance of the shunt reactive elements must match in that range. This can be achieved again by the proper selection of the values of the capacitors and inductors that are used in the shunt reactive element tank circuits.

DESCRIPTION OF THE PREFERRED EMBODIMENT

Figure 4A:
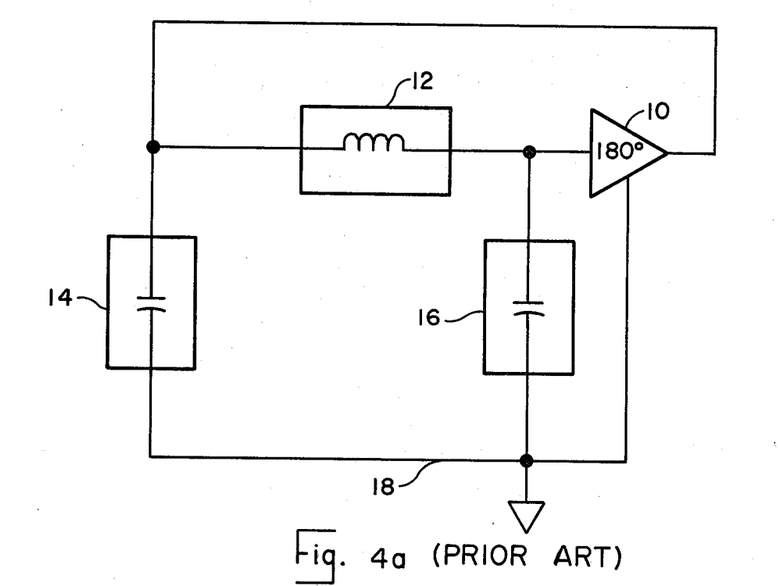
FIGS. 4a and 4b are schematic representations of basic Colpitts and Hartley oscillators, respectively.
Figure 4B:
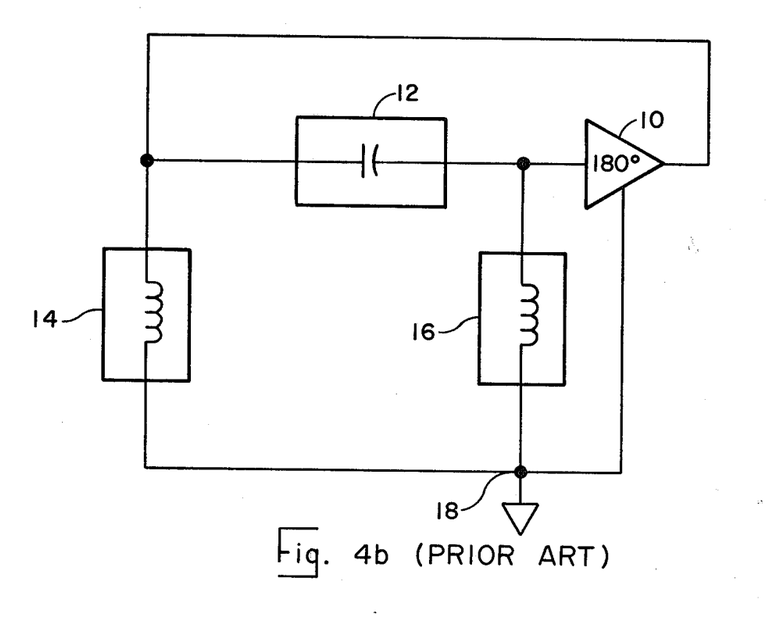

FIGS. 4a and 4b show simplified circuit diagrams of two well known oscillator circuits. Each of these circuits includes an inverting amplifier 10, a series reactive element 12, and two shunt reactive elements 14 and 16. The shunt reactive elements 14 and 16 have one end connected to opposite ends of the series reactive element 12. The other end of each of the shunt reactive elements 14 and 16 are connected in common to return line 18. The junction between series reactive element 12 and shunt reactive element 16 is connected to the input terminal of inverting amplifier 10. Additionally, the output of inverting amplifier 10 is connected to the junction between series reactive element 12 and shunt reactive element 14. The circuit configuration in FIG. 4a includes an inductor as the series reactive element 12 and capacitive elements 14 and 16 making this a Colpitts type oscillator. FIG. 4b shows a complimentary circuit wherein the series reactive element 12 is a capacitor and shunt reactive elements 14 and 16 are inductors making this a Hartley type oscillator.

Figure 5A:
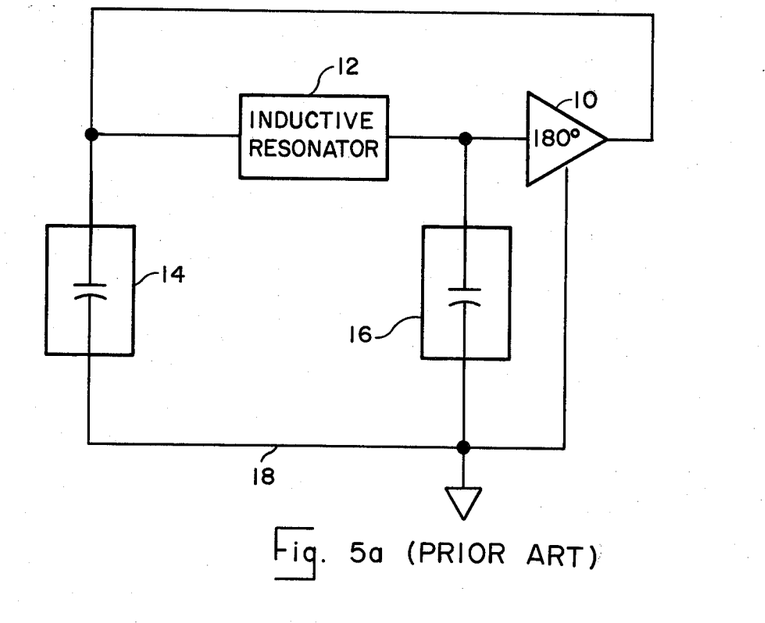
FIGS. 5a and 5b are schematic representations of oscillators having a series resonator element in the Colpitts and Hartley configurations, respectively.
Figure 5B:
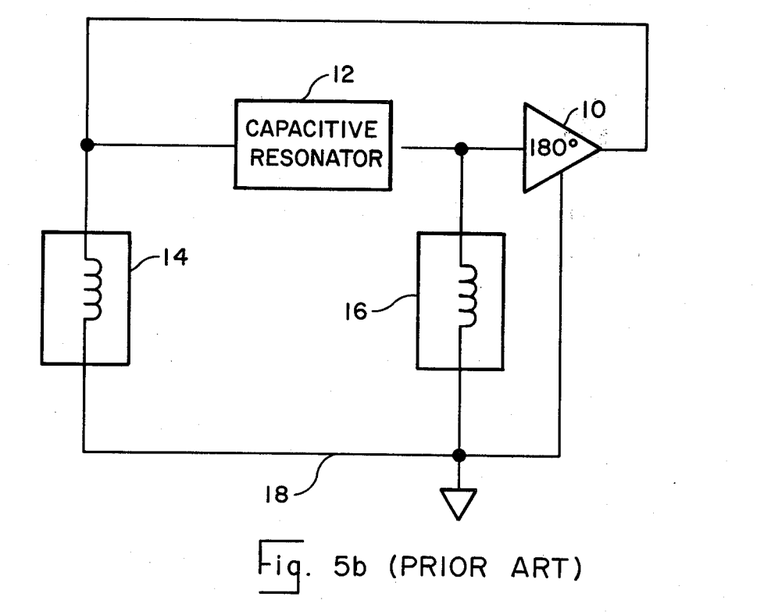

FIGS. 5a and 5b represent oscillator circuits which are similar to the Colpitts and Hartley type circuits respectively of FIGS. 4a and 4b. In each of these circuits the series reactive element 12 as shown in FIGS. 4a and 4b has been replaced with a resonator element such as a crystal resonator. A crystal resonator has the advantage of appearing to have either a capacitive or an inductive reactance characteristic depending on the tuning effect of the shunt reactive elements. The advantage to using a crystal resonator over the simple series reactive elements of FIGS. 4a and 4b is that it typically has a very high Q or phase to frequency slope relationship resulting in a much stabler output frequency.

Figure 6A:
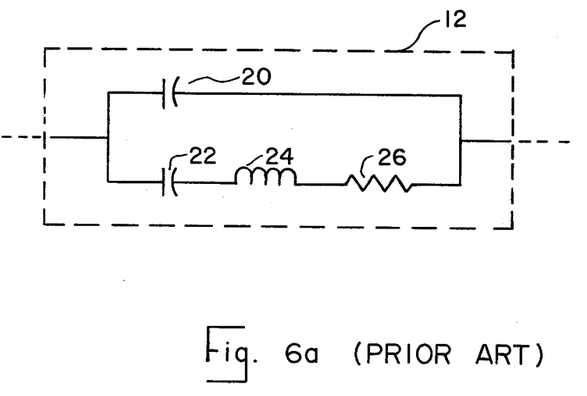
FIG. 6a is a schematic representation of an equivalent circuit of a crystal resonator.
Figure 6B:
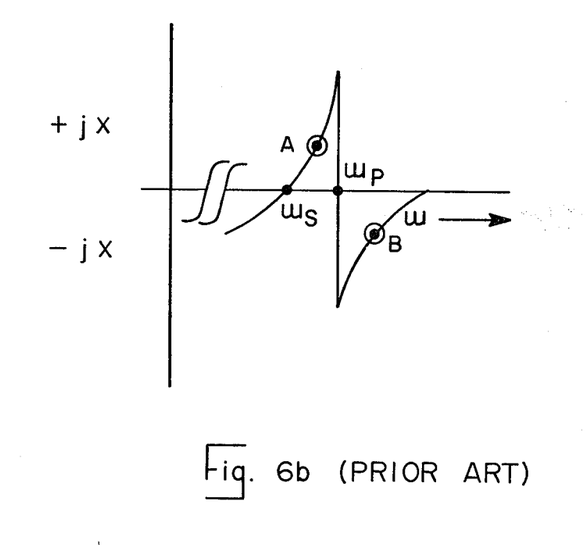
FIG. 6b is a graphical representation of the reactance of a crystal resonator versus frequency.

FIG. 6a shows an equivalent circuit for a crystal resonator having both a series and a parallel resonance path. It is this combination of resonances that permits the crystal resonator to be used as either an inductive or a capacitive reactance in an oscillator circuit. A reactive versus frequency curve of the equivalent circuit of a crystal resonator is shown in FIG. 6b. From this figure we can see that when a crystal resonator is used as the series reactive element 12 in a Colpitts type oscillator (FIG. 5a), it acts as an inductive element operating at a point between series resonance, $\omega_s$ and parallel resonance, $\omega_p$, on the positive going portion of the curve. This being a positive reactive portion of the curve indicates that crystal is inductive at this frequency. The exact location of point A between $\omega_s$ and $\omega_p$ depends on the equivalent capacitance of the remainder of the oscillator circuit. If the crystal resonator were used in place of the series reactive element 12 in the Hartley type circuit (FIG. 5b), the crystal resonator will appear to be a capacitor and operate at point B on the negative going portion of the reactance curve. In the negative portion of the reactance curve, the crystal resonator has a capacitive reactance.

Figure 1:
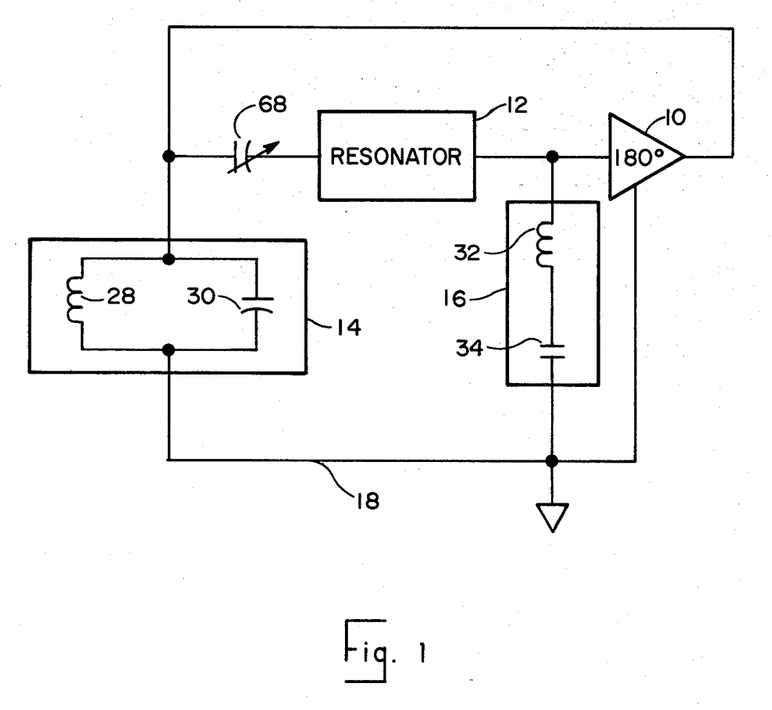
FIG. 1 is a schematic representation of one embodiment of an oscillator circuit of the present invention oscillating only within a selected range of frequencies.

One embodiment of the present invention is shown in FIG. 1. The oscillator circuit depicted in this figure is similar to those shown in FIGS. 4a and 4b. Here the series reactive element 12 is shown as a resonator, typically a crystal resonator, and shunt reactive elements 14 and 16 were shown respectively as a parallel and a series reactive tank circuits. This approach is a two-arm bandpass mode suppression approach. In this figure shunt reactive element 14 consists of inductor 28 connected in parallel with capacitor 30 and shunt reactive element 16 consists of inductor 32 connected in series with capacitor 34. Variable capacitor 68 is shown connected in series with resonator 12 and provides a small degree of fine tuning for the oscillator frequency (point A of FIG. 6b).

As in any oscillator, it is necessary that the feedback circuit provide a 180° phase shift in order to obtain oscillation. This 180° phase shift can only be obtained when the series reactive element 12 has a reactance characteristic that is of a different sign from that of the two shunt reactive elements 14 and 16, i.e., if the series reactive element 12 is inductive having positive reactance, for the circuit to oscillate both shunt reactive elements 14 and 16 must be capacitive, having negative reactance. To achieve this result in the circuit of FIG. 1, it is necessary to select the element values of inductors 28 and 32 and capacitors 30 and 34 in such a way that this result is achieved in a preselected band of frequencies. Since we are using a crystal resonator as the series reactive element 12, the band which is selected must contain one of the frequencies of oscillation of that resonator.

Thus, if we choose to operate the circuit in the Colpitts or Pierce configuration, the resonator 12 will have to appear to be inductive when both shunt reactive elements 14 and 16 appear to be capacitive. To obtain oscillation of the circuit of FIG. 1 only within a selected band of frequencies it is necessary to select the component values of the individual elements of shunt reactive elements 14 and 16 such that their resonance frequencies are the upper and lower oscillation band frequencies. Additionally, it is necessary for both of shunt reactive elements 14 and 16 to have a negative, or capacitive, reactance between those frequencies. A parallel tank of the type shown as shunt reactive element 14 in FIG. 1 has an inductive reactance below its resonant frequency, $f_1$, and a capacitive reactance above $f_1$. Similarly, the series tank of the type shown in FIG. 1 as shunt reactive element 16 has a capacitive reactance below its resonant frequency, $f_2$, and inductive reactance above $f_2$. Thus, $f_1$ must be less than $f_2$ so that shunt reactive elements 14 and 16 both have a negative, or capacitive, reactance between $f_1$ and $f_2$ to achieve the desired bandpass effect. In this case the oscillator will have the necessary 180° phase shift in the feedback circuit only between the frequencies $f_1$ and $f_2$. If we had chosen to operate the oscillator in the Hartley configuration, we would have selected the values of the inductors 28 and 32, and capacitors 30 and 34 such that shunt reactive elements 14 and 16 both appear to be inductive within the desired band. To achieve that result, $f_1$ would have to be greater than $f_2$.

Figure 2A:
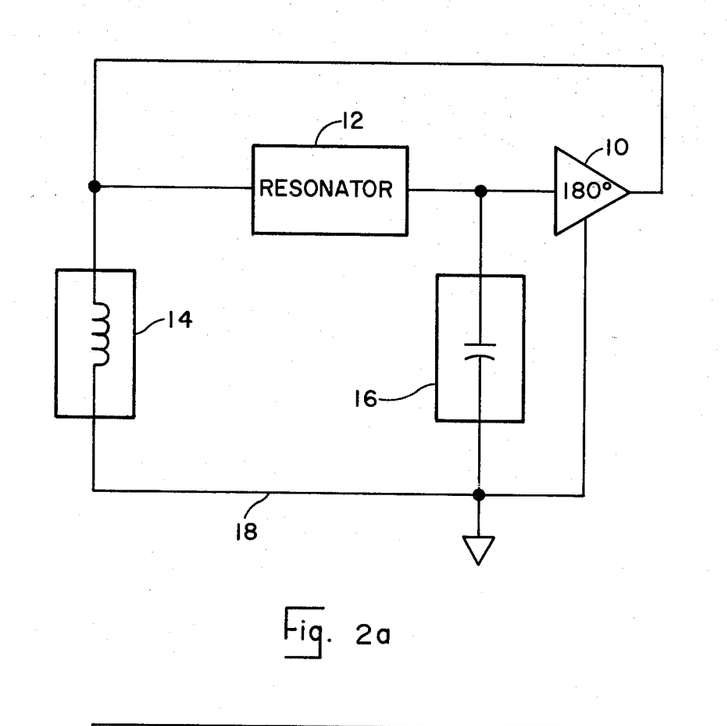
FIGS. 2a, 2b and 2c are schematic representations of the circuit of FIG. 1 operating in a Colpitts or Pierce configuration at frequencies below, between, and above, respectively, two preselected frequencies that define the band in which the circuit oscillates.
Figure 2B:
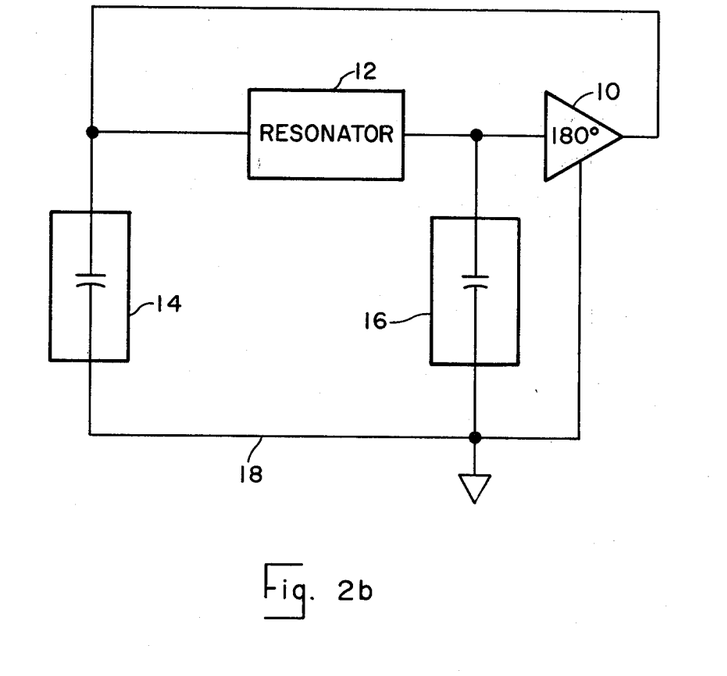
Figure 2C:
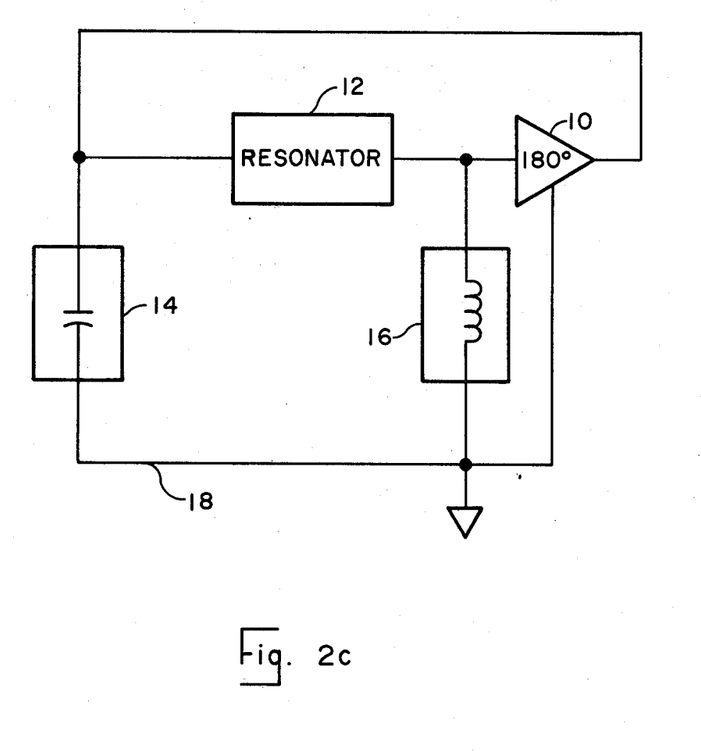

In FIGS. 2a, 2b and 2c there is shown the circuit of FIG. 1 operating in the Colpitts configuration. The circuit in FIG. 2a represents the effective reactance of shunt reactive elements 14 and 16 below the lower band limit frequency, $f_1$, wherein the shunt reactive element 14 has an inductive reactance and the shunt reactive element 16 has a capacitive reactance. Therefore, no oscillation occurs since in this configuration there would not be a 180° phase shift in the feedback circuit. FIG. 2b similarly shows the shunt reactive elements 14 and 16 between the selected band frequencies $f_1$ and $f_2$. Here both shunt reactive elements 14 and 16 have a capacitive reactance and therefore the necessary 180° phase shift required for oscillation is present in the feedback circuit. Finally, in FIG. 2c the shunt reactive elements 14 and 16 are shown as to their effective values above the upper band frequency, $f_2$. Here again the shunt elements have dissimilar reactances and therefore there would be no oscillation.

Figure 3A:
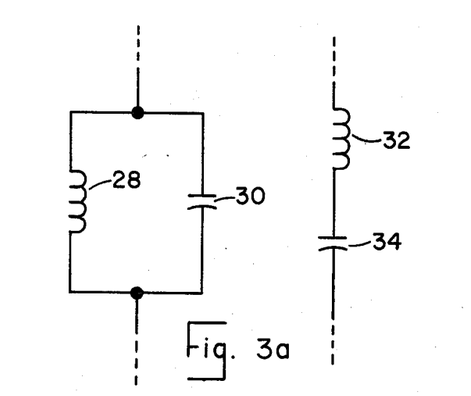
FIGS. 3a through 3e are schematic representations of additional shunt arm circuit pair configurations that may be substituted for the pair shown in FIG. 1.

FIGS. 3a through 3e represent a collection of various shunt reactive element combinations that may be used for shunt reactive circuits 14 and 16. FIG. 3a shows the circuits that were discussed in relation to FIG. 1 and we have seen that it lends itself to either the Hartley or the Colpitts configuration. It should be noted here that these shunt elements of FIG. 3a may be interchanged with the series tank being used for shunt reactive element 14 and the parallel tank for shunt reactive element 16 without a loss of the desired operating characteristics.

Figure 3B:
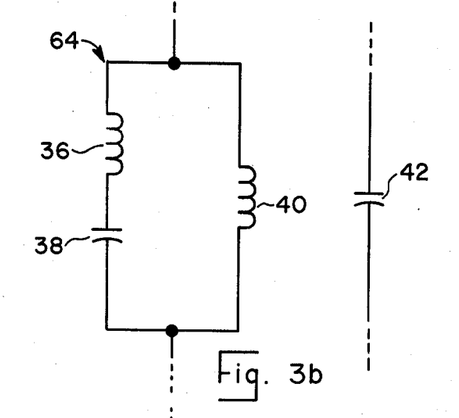
Figure 3C:
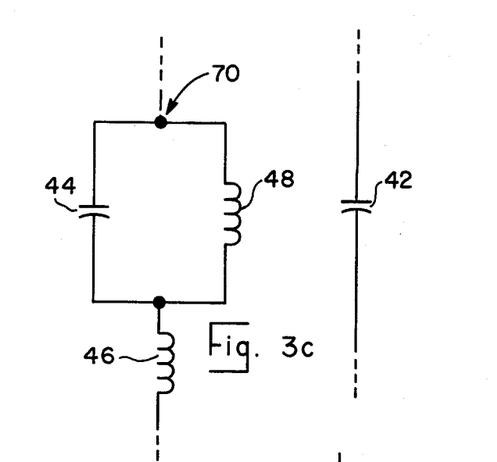

The shunt reactive element circuit pairs shown in FIGS. 3b through 3e are of the one arm bandpass mode suppression type. These are designated as such since the entire bandpass effect is created in only one of the shunt legs of the oscillator. Those shown in FIGS. 3b and 3c are for a Colpitts type configuration and those shown in FIGS. 3d and 3e for a Hartley configuration. Additional similarity between these can be seen between FIGS. 3b and 3d wherein the bandpass tank has both a series and a parallel resonance. The similarity between FIGS. 3c and 3e exists in that there is a parallel tank in series with either a capacitor or an inductor.

If the shunt circuit pair of FIG. 3b is used in the circuit of FIG. 1 for shunt reactive elements 14 and 16 respectively, or in the reverse order, a series parallel tank of shunt arm 64 will have an inductive characteristic at the high and low frequencies and a capacitive characteristic in the desired band region. As $\omega \to \infty$, the reactance of capacitor 38 approaches a short circuit so that the shunt leg 64 is effectively reduced to inductor 36 in parallel with inductor 40 and therefore has an inductive characteristic. As $\omega \to 0$, the reactance of capacitor 38 approaches an open circuit so that shunt leg 64 effectively reduces to inductor 40 alone. To understand how the circuit has a capacitive reactance at mid band, we will first consider only the series tank of inductor 36 and capacitor 38. The series tank at frequencies below the series resonance, $\omega_s$, has a capacitive reactance. Above this resonance frequency it has an inductive reactance. At its resonance frequency, $\omega_s$, it has a zero impedance or is effectively a short circuit. Very close to and slightly below $\omega_s$ this series tank portion has a capacitive reactance that is close to zero, i.e., it has a large capacitive component. In other words, the series tank looks like capacitor 38 at low frequencies and its capacitive reactance approaches zero as $\omega \to \omega_s$. If we now add the effect of inductor 40 in parallel with the series tank we note that as long as the equivalent capacitive reactance of the series tank is very small this capacitor reactance will shunt out the inductive reactance of inductor 40 and the total shunt arm 64 will have a capacitive reactance over all and appear to be a capacitor.

Figure 3D:
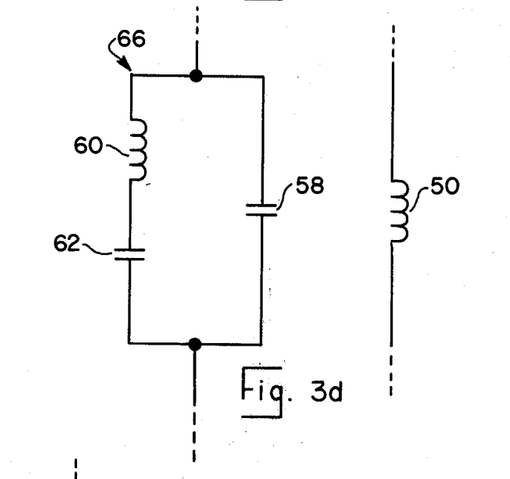

The Hartley oscillator pair of shunt elements shown in FIG. 3d operates very similarly to the Colpitts shunt arm circuits shown in FIG. 3b. In the series parallel tank 66 of FIG. 3d, at low and high frequencies it has a capacitive reactance and within the desired band it has an inductive reactance thus providing the bandpass effect that we saw with shunt arm 64 in FIG. 3b. Series parallel tank 66 operates very similarly to series parallel tank 64 of FIG. 3b.

Figure 3E:
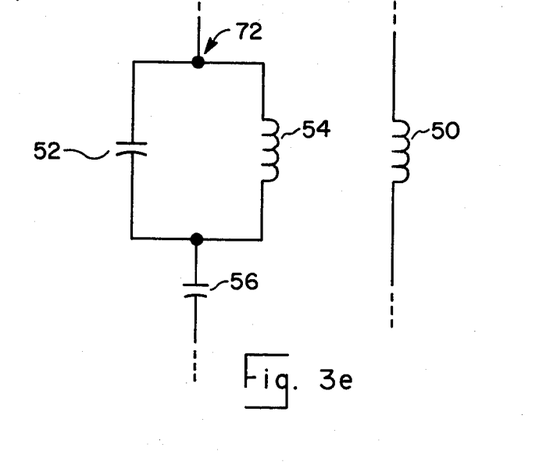

The bandpass shunt arm circuits 70 and 72 of FIG. 3c and 3e, respectively, operate in the same way as shunt arm circuits 64 and 66 of FIGS. 3b and 3d, respectively. Through the proper choice of inductor and capacitor values for shunt leg 70 of FIG. 3c, it can easily be seen that this circuit at low and high frequencies would have an inductive reactance and in a midband region could be made to have a capacitive reactance. At low frequencies the reactance of inductor 48 would be very small approaching zero and thus effectively shunting capacitor 44 leaving us with inductor 46 making up the shunt arm. At high frequencies the reactance of capacitor 44 approaches zero and effectively shunts inductor 48. Thus, shunt arm 70 appears as simply inductor 46. At midband, just above the resonance frequency of capacitor 44 and inductor 48, the parallel tank would have a high negative reactance while inductor 46 had a moderate positive reactance and again through proper selection of the circuit elements the sum of the reactances could be made to remain negative within the desired band and thus allowing oscillation within that band in the Colpitts configuration.

The Hartley configuration shunt arm 72 shown in FIG. 3e operates in a similar manner to the Colpitts configuration shunt arm 70 of FIG. 3c with just the reverse effect, i.e., at high and low frequencies shunt arm 72 would have a capacitive reactance and in the midband region would have the desired inductive reactance through the proper choice of the element values of the capacitors 52 and 56 and inductor 54.

I claim:

1. Signal Oscillator with mode suppression apparatus for limiting the frequencies of oscillation to a selected band of frequencies, said apparatus comprising:

inverting amplifier means having an input terminal and an output terminal; and signal feedback means for providing a 180° phase shift in the selected band of frequencies, said signal feedback means including:

crystal resonator means connected in series between the input and output terminals of the inverting amplifier means for producing a relatively stable oscillator output signal; and first and second shunt reactive means for suppressing oscillation outside the selected band of frequencies, said first shunt reactive means having one end connected to the input terminal of the inverting amplifier means, said second shunt reactive means having one end connected to the output terminal of the inverting amplifier means, the other ends of the first and second shunt reactive means being connected one to the other;

at least one of said first and second shunt reactive means having a resonant tank circuit, said resonant tank circuit having a reactance value such that for each frequency outside the selected band of frequencies at least one of said first and second shunt reactive means has reactance value of the same sign as the reactance value of the crystal resonator means.

2. Signal oscillator with mode suppression apparatus as in claim 1 wherein one of said first and second shunt reactive means includes a parallel resonant tank and the other of said first and second shunt reactive means includes a series resonant tank.

3. Signal oscillator with mode suppression apparatus as in claim 2 wherein:

said parallel resonant tank has a resonant frequency, $f_1$, and said parallel tank has a negative reactance above $f_1$ and a positive reactance below $f_1$; and said series resonant tank has a resonant frequency, $f_2$, and said series tank has a positive reactance above $f_2$ and a negative reactance below $f_2$;

said resonant frequencies $f_1$ and $f_2$ defining said selected band of frequencies.

4. Signal oscillator with mode suppression apparatus as in claim 3 wherein $f_1$ is selected to be less than $f_2$ causing said crystal resonator means to assume a positive reactance value between $f_1$ and $f_2$ and the oscillator to operate in a Colpitts configuration between frequencies $f_1$ and $f_2$.

5. Signal oscillator with mode suppression apparatus as in claim 3 wherein $f_2$ is selected to be less than $f_1$ causing said crystal resonator means to assume a negative reactance value between $f_2$ and $f_1$ and the oscillator to operate in the Hartley configuration between frequencies $f_2$ and $f_1$.

6. Signal oscillator with mode suppression apparatus as in claim 1 wherein:
   one of said first and second shunt reactive means includes a tank circuit having a series resonant path and a parallel resonant path; and
   the other of said first and second shunt reactive means includes a first non-resonant reactive circuit;
   a tank circuit configured as above defined has a series resonant frequency and a parallel resonant frequency, these frequencies defining the band of frequencies between which oscillation is possible.

7. Signal oscillator with mode suppression apparatus as in claim 6 wherein the tank circuit comprises a series resonant reactive circuit path in parallel with a second non-resonant reactive circuit path.

8. Signal oscillator with mode suppression apparatus as in claim 7 wherein the series resonant reactive circuit path comprises an inductor connected in series with a capacitor.

9. Signal oscillator with mode suppression apparatus as in claim 8 wherein:
   said second non-resonant reactive circuit path comprises an inductor; and
   said first non-resonant reactive circuit comprises a capacitor.

10. Signal oscillator with mode suppression apparatus as in claim 9 wherein:
    said second non-resonant reactive circuit path comprises a capacitor; and
    said first non-resonant reactive circuit comprises an inductor.

11. Signal oscillator with mode suppression apparatus as in claim 6 wherein the tank circuit comprises a parallel resonant reactive circuit path in series with a second non-resonant reactive circuit path.

12. Signal oscillator with mode suppression apparatus as in claim 11 wherein the parallel resonant reactive circuit path comprises an inductor connected in parallel with a capacitor.

13. Signal oscillator with mode suppression apparatus as in claim 12 wherein:
    said second non-resonant reactive circuit path comprises an inductor; and
    said first non-resonant reactive circuit comprises a capacitor.

14. Signal oscillator with mode suppression apparatus as in claim 13 wherein:
    said second non-resonant reactive circuit path comprises a capacitor; and
    said first non-resonant reactive circuit comprises an inductor.

* * * * *